United States Patent
Zhu et al.

(10) Patent No.: US 9,449,938 B2
(45) Date of Patent: Sep. 20, 2016

(54) CONDUCTIVE DIE ATTACH FILM FOR LARGE DIE SEMICONDUCTOR PACKAGES AND COMPOSITIONS USEFUL FOR THE PREPARATION THEREOF

(71) Applicant: Henkel IP & Holding GmbH, Duesseldorf (DE)

(72) Inventors: Pukun Zhu, Irvine, CA (US); Gina V. Hoang, Garden Grove, CA (US); Shashi K. Gupta, Tustin, CA (US); Andrew Laib, Fullerton, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 15/010,531

(22) Filed: Jan. 29, 2016

(65) Prior Publication Data

US 2016/0148894 A1 May 26, 2016

Related U.S. Application Data

(63) Continuation of application No. PCT/US2014/058000, filed on Sep. 29, 2014.

(60) Provisional application No. 61/884,844, filed on Sep. 30, 2013.

(51) Int. Cl.
| | |
|---|---|
| H01L 23/48 | (2006.01) |
| H01L 23/52 | (2006.01) |
| H01L 29/40 | (2006.01) |
| H01L 23/00 | (2006.01) |
| C09J 163/10 | (2006.01) |
| C08L 63/10 | (2006.01) |
| H01B 1/22 | (2006.01) |

(52) U.S. Cl.
CPC ............... *H01L 24/32* (2013.01); *C08L 63/10* (2013.01); *C09J 163/10* (2013.01); *H01B 1/22* (2013.01); *H01L 24/27* (2013.01); *H01L 2224/2741* (2013.01); *H01L 2224/27848* (2013.01); *H01L 2224/2929* (2013.01); *H01L 2224/29311* (2013.01); *H01L 2224/29313* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29369* (2013.01); *H01L 2224/29387* (2013.01); *H01L 2224/29388* (2013.01); *H01L 2224/29393* (2013.01); *H01L 2224/29439* (2013.01); *H01L 2224/29455* (2013.01); *H01L 2224/32225* (2013.01); *H01L 2224/32245* (2013.01); *H01L 2924/0132* (2013.01); *H01L 2924/01051* (2013.01); *H01L 2924/0544* (2013.01); *H01L 2924/0549* (2013.01); *H01L 2924/06* (2013.01); *H01L 2924/069* (2013.01); *H01L 2924/0635* (2013.01); *H01L 2924/0645* (2013.01); *H01L 2924/0665* (2013.01); *H01L 2924/0695* (2013.01); *H01L 2924/0715* (2013.01); *H01L 2924/2064* (2013.01); *H01L 2924/20103* (2013.01); *H01L 2924/20105* (2013.01); *H01L 2924/20106* (2013.01); *H01L 2924/3511* (2013.01)

(58) Field of Classification Search
CPC .......... H01L 2224/8385; H01L 24/73; H01L 2924/16225; H01L 21/6836; H01L 23/3171; H01L 33/56
USPC .................................. 257/782, 783; 438/118
See application file for complete search history.

(56) References Cited

U.S. PATENT DOCUMENTS

| | | | |
|---|---|---|---|
| 4,020,036 A | 4/1977 | South, Jr. | |
| 4,101,604 A | 7/1978 | Rowe | |
| 4,160,759 A | 7/1979 | Gardner et al. | |
| 4,161,471 A | 7/1979 | Kassal | |
| 5,397,618 A | 3/1995 | Cedarleaf | |
| 5,510,197 A | 4/1996 | Takahashi et al. | |
| 5,717,034 A | 2/1998 | Dershem et al. | |
| 7,037,447 B1 | 5/2006 | Yang et al. | |
| 7,326,369 B2 | 2/2008 | Cheng et al. | |
| 7,851,254 B2 | 12/2010 | Forray et al. | |
| 8,754,178 B2* | 6/2014 | Kawana ............... | C09D 135/00 526/258 |
| 9,074,113 B2* | 7/2015 | Takamoto ............ | C09J 163/00 257/778 |
| 2005/0288457 A1 | 12/2005 | Liu et al. | |
| 2011/0070436 A1* | 3/2011 | Nguyen ............... | C09J 153/00 428/355 EP |

(Continued)

FOREIGN PATENT DOCUMENTS

| | | |
|---|---|---|
| WO | 03082940 | 10/2003 |
| WO | 2012022011 | 2/2012 |

OTHER PUBLICATIONS

International Search Report issued in connection with International Patent Application No. PCT/US2014/058000 mailed on Jan. 29, 2015.

*Primary Examiner* — Shelia V Clark
(74) *Attorney, Agent, or Firm* — Steven C. Bauman

(57) ABSTRACT

Provided herein are conductive die attach films having advantageous properties for use in a variety of applications, e.g., for the preparation of large die semiconductor packages. Also provided are formulations useful for the preparation of such films, as well as methods for making such formulations. In additional aspects of the present invention, there are provided conductive networks prepared from compositions according to the present invention. In additional aspects, the invention further relates to articles comprising such conductive die attach films adhered to a suitable substrate therefor.

45 Claims, No Drawings

(56) References Cited

U.S. PATENT DOCUMENTS

2014/0120356 A1* 5/2014 Shearer .................... C09J 11/02
   428/457
2014/0199549 A1* 7/2014 Shin ....................... C09J 161/06
   428/402
2014/0220337 A1* 8/2014 Nguyen .................. C09J 153/00
   428/355 EP
2015/0194376 A1* 7/2015 Shimobe ............. H01L 23/3107
   257/676
2015/0364357 A1* 12/2015 Takamoto ........... H01L 21/6836
   257/778

* cited by examiner

CONDUCTIVE DIE ATTACH FILM FOR LARGE DIE SEMICONDUCTOR PACKAGES AND COMPOSITIONS USEFUL FOR THE PREPARATION THEREOF

FIELD OF THE INVENTION

The present invention relates to conductive die attach films and formulations useful for the preparation of such films. In one aspect, the invention relates to methods for making such formulations. In another aspect, the invention relates to conductive networks prepared from compositions according to the present invention, and methods for making same. In yet another aspect, the invention relates to articles comprising invention conductive die attach films adhered to a suitable substrate therefor, and methods for making same.

SUMMARY OF THE INVENTION

In accordance with the present invention, there are provided conductive die attach films having advantageous properties for use in large die semiconductor packages. Also provided are formulations useful for the preparation of such films, as well as methods for making such formulations.

In accordance with another aspect of the present invention, there are provided conductive networks prepared from compositions according to the present invention. In certain aspects, the invention relates to articles comprising such conductive die attach films adhered to a suitable substrate therefor.

DETAILED DESCRIPTION OF THE INVENTION

In accordance with the present invention, there are provided compositions comprising:

a first maleimide, nadimide or itaconimide, wherein said first maleimide, nadimide or itaconimide has an aromatic backbone, and the degree of substitution of imide moieties on the backbone of said first maleimide, nadimide or itaconimide is at least 0.5 imide moieties per repeat unit of said backbone, a second maleimide, nadimide or itaconimide, wherein said second maleimide, nadimide or itaconimide has a flexible aliphatic or aliphatic/aromatic backbone, wherein the backbone of said second maleimide, nadimide or itaconimide includes straight or branched chain hydrocarbyl segments, wherein each hydrocarbyl segment has at least 20 carbons, a first epoxy resin, wherein said first epoxy resin is rubber or elastomer-modified, a second epoxy resin, wherein said second epoxy resin has a flexible aliphatic or aliphatic/aromatic backbone, wherein the backbone of said second epoxy resin includes straight or branched chain hydrocarbyl segments, wherein each hydrocarbyl segment has at least 20 carbons, backbone, a conductive filler, a curing agent; and optionally a non-reactive organic diluent therefore;

wherein:

said composition, when cured, has a modulus less than about 1 GPa when tested by dynamic mechanical analysis (DMA) at 260° C.

In certain embodiments, the degree of substitution of imide moieties on the backbone of the first maleimide, nadimide or itaconimide is at least 0.8 imide moieties per repeat unit of said backbone; in certain embodiments, the degree of substitution on the backbone of the first maleimide, nadimide or itaconamide is at least 1 imide moiety per repeat unit of said backbone.

In certain embodiments, the first maleimide, nadimide or itaconimide contemplated for use in the practice of the present invention has the structure:

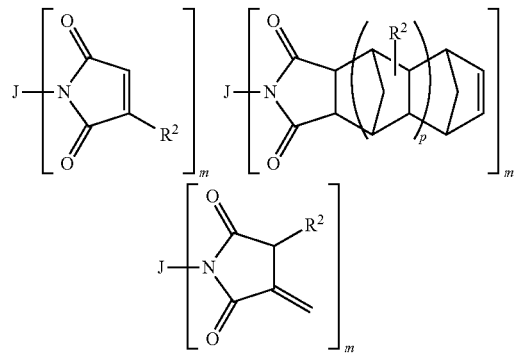

respectively, wherein:

m is 1-15, p is 0-15, each $R^2$ is independently selected from hydrogen or lower alkyl, and J is a monovalent or a polyvalent radical selected from:

aromatic hydrocarbyl or substituted aromatic hydrocarbyl species having in the range of about 6 up to about 300 carbon atoms, where the aromatic hydrocarbyl species is selected from aryl, alkylaryl, arylalkyl, aryalkenyl, alkenylaryl, arylalkynyl or alkynylaryl;

aromatic hydrocarbylene or substituted aromatic hydrocarbylene species having in the range of about 6 up to about 300 carbon atoms, where the aromatic hydrocarbylene species are selected from arylene, alkylarylene, arylalkylene, arylalkenylene, alkenylarylene, arylalkynylene or alkynylarylene, heterocyclic or substituted heterocyclic species having in the range of about 6 up to about 300 carbon atoms, polysiloxane, or polysiloxane-polyurethane block copolymers, as well as combinations of one or more of the above with a linker selected from a covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—, —O—NR—S(O)$_2$—O—, —O—NR—S(O)$_2$—NR—, —O—P(O)R$_2$—, —S—P(O)R$_2$—, or —NR—P(O)R$_2$—; where each R is independently hydrogen, alkyl or substituted alkyl.

In some embodiments of the present invention, J of the above-described maleimide, nadimide or itaconimide is heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Examples of first maleimide, nadimide, or itaconamide contemplated for use herein include:

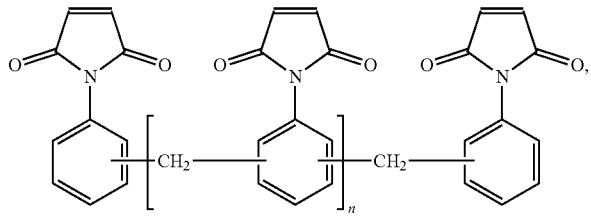

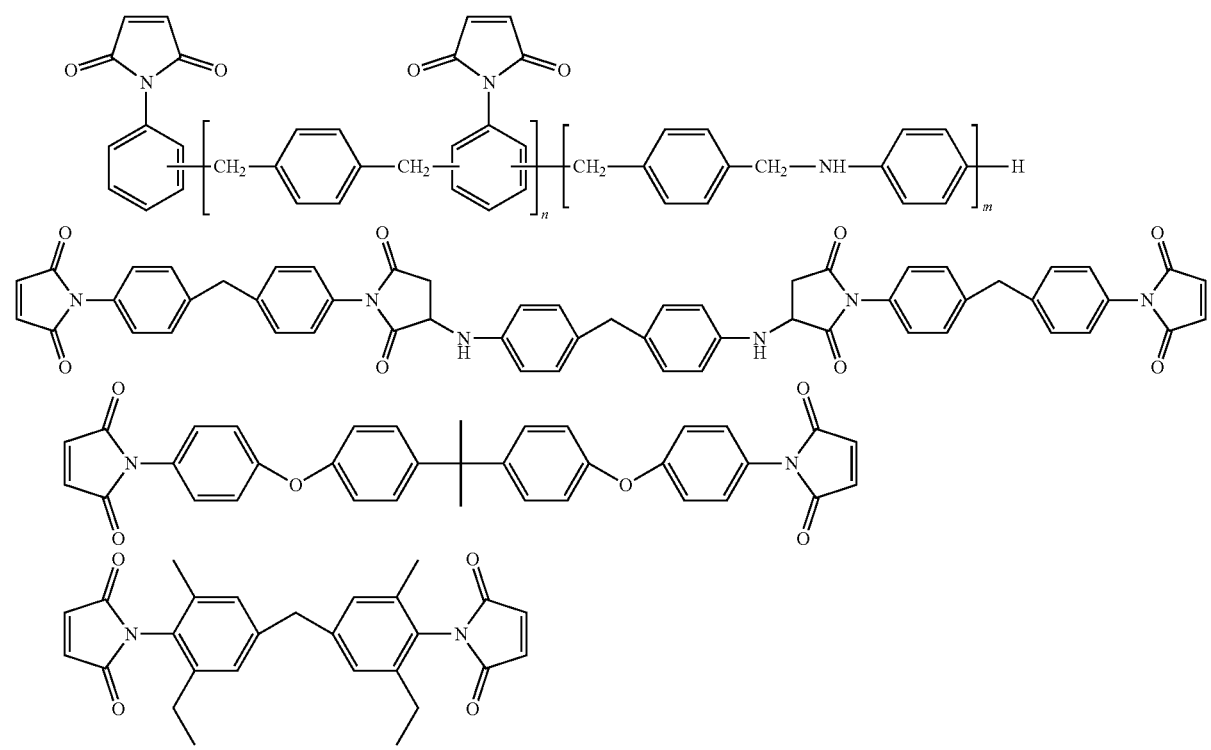

In certain embodiments, the backbone of the second maleimide, nadimide or itaconimide contemplated for use herein contains straight or branched chain hydrocarbyl segments, wherein each hydrocarbyl segment has at least 30 carbons, thereby enhancing the flexibility thereof.

In certain embodiments, the second maleimide, nadimide or itaconimide contemplated for use herein has the structure:

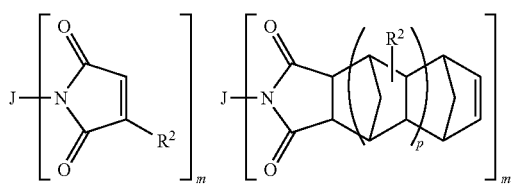

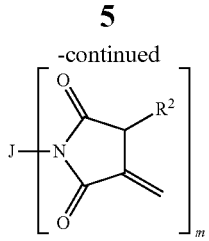

respectively, wherein:
m is 1-15,
p is 0-15,
each $R^2$ is independently selected from hydrogen or lower alkyl, and
J is a monovalent or a polyvalent radical selected from:
non-aromatic hydrocarbyl or substituted non-aromatic hydrocarbyl species having in the range of about 20 up to about 500 carbon atoms, where the non-aromatic hydrocarbyl species is selected from alkyl, alkenyl, alkynyl, cycloalkyl, or cycloalkenyl;
non-aromatic hydrocarbylene or substituted non-aromatic hydrocarbylene species having in the range of about 20 up to about 500 carbon atoms, where the non-aromatic hydrocarbylene species are selected from alkylene, alkenylene, alkynylene, cycloalkylene, or cycloalkenylene,
heterocyclic or substituted heterocyclic species having in the range of about 20 up to about 500 carbon atoms,
polysiloxane, or
polysiloxane-polyurethane block copolymers, as well as combinations of one or more of the above with a linker selected from a covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

In certain embodiments, J of the above-described maleimide, nadimide or itaconimide is oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Examples of second maleimide, nadimide, itaconamide contemplated for use herein include:

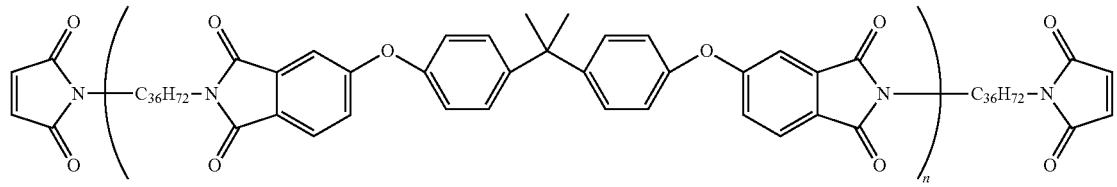

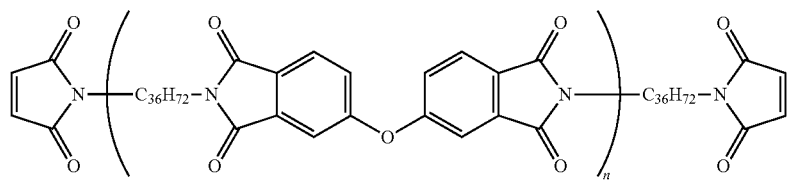

-continued
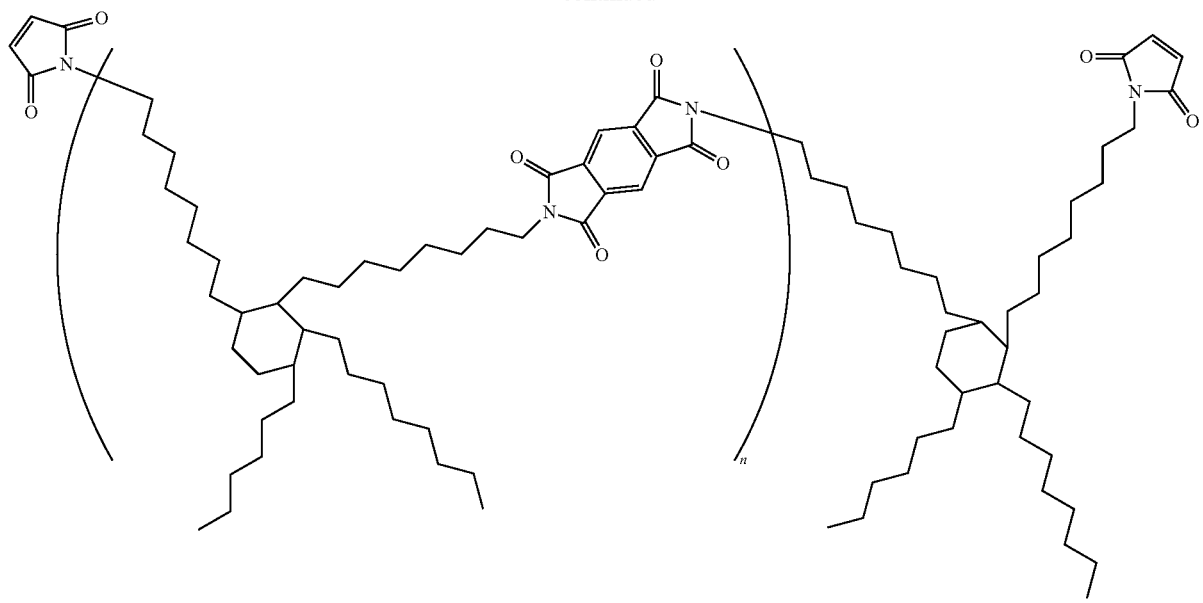
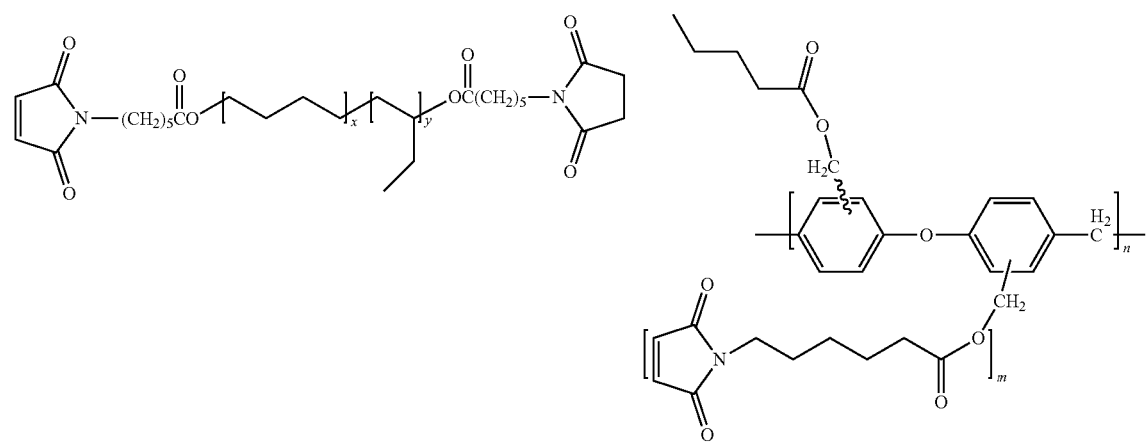
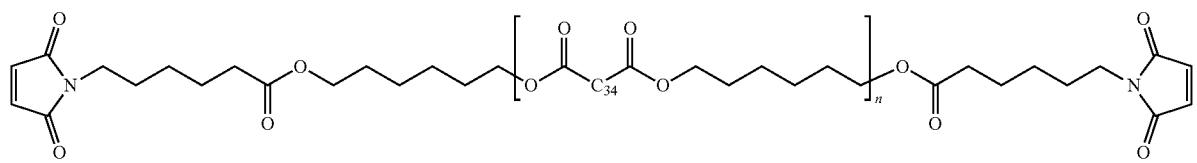
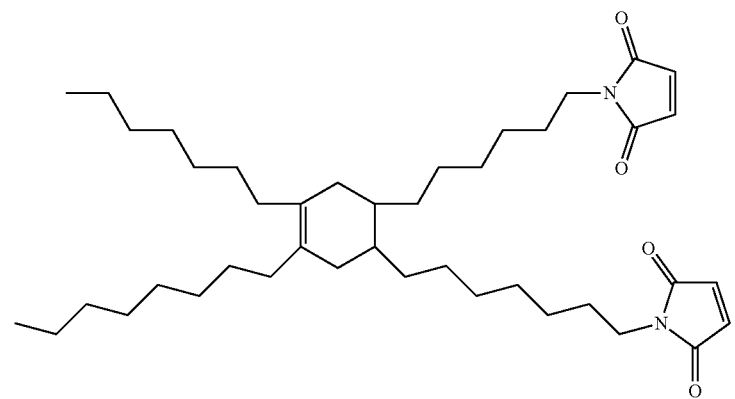 [SMILES: CCCCCCCCC1=C(CCCCCCC)CC(CCCCCCN2C(=O)C=CC2=O)C(CCCCCCCN2C(=O)C=CC2=O)C1]

In certain embodiments, the first epoxy resin contemplated for use herein is an epoxidized carboxyl-terminated butadiene-acrylonitrile (CTBN) oligomer or polymer.

In certain embodiments, the epoxidized CTBN oligomer or polymer is an epoxy-containing derivative of an oligomeric or polymeric precursor having the structure:

wherein:

each Bu is a butylene moiety (e.g., 1,2-butadienyl or 1,4-butadienyl), each ACN is an acrylonitrile moiety, the Bu units and the ACN units can be arranged randomly or in blocks, each of x and y are greater than zero, provided the total of x+y=1, the ratio of x:y falls in the range of about 10:1-1:10, and m falls in the range of about 20 about 100.

As readily recognized by those of skill in the art, epoxidized CTBN oligomers or polymers can be made in a variety of ways, e.g., from (1) a carboxyl terminated butadiene/acrylonitrile copolymer, (2) an epoxy resin and (3) bisphenol A:

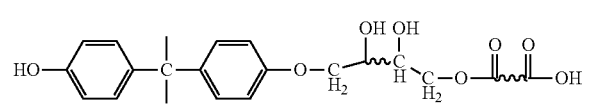

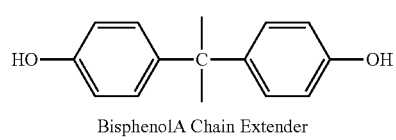

BisphenolA Chain Extender

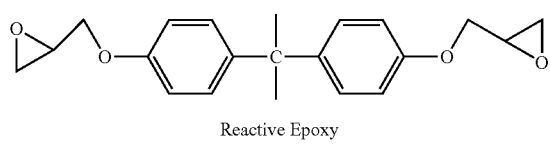

Reactive Epoxy

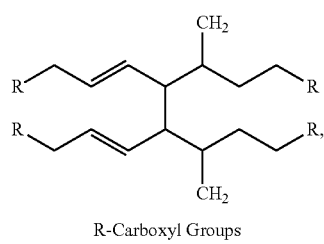

R-Carboxyl Groups by reaction between the carboxylic acid group of CTBN and epoxies (via chain-extension reactions), and the like.

Examples of the first epoxy resin (i.e., rubber or elastomer-modified epoxy) include epoxidized CTBN oligomers or polymers made from (1) a carboxyl terminated butadiene/acrylonitrile copolymer, (2) an epoxy resin and (3) bisphenol A as described above; Hypro™ Epoxy-Functional Butadiene-Acrylonitrile Polymers (formerly Hycar® ETBN), and the like.

Rubber or elastomer-modified epoxies include epoxidized derivatives of:

(a) homopolymers or copolymers of conjugated dienes having a weight average molecular weight ($M_w$) of 30,000 to 400,000 or higher as described in U.S. Pat. No. 4,020,036 (the entire contents of which are hereby incorporated by reference herein), in which conjugated dienes contain from 4-11 carbon atoms per molecule (such as 1,3-butadiene, isoprene, and the like);

(b) epihalohydrin homopolymers, a copolymer of two or more epihalohydrin monomers, or a copolymer of an epihalohydrin monomer(s) with an oxide monomer(s) having a number average molecular weight ($M_n$) which varies from about 800 to about 50,000, as described in U.S. Pat. No. 4,101,604 (the entire contents of which are hereby incorporated by reference herein);

(c) hydrocarbon polymers including ethylene/propylene copolymers and copolymers of ethylene/propylene and at least one nonconjugated diene, such as ethylene/propylene/hexadiene/norbornadiene, as described in U.S. Pat. No. 4,161,471; or (d) conjugated diene butyl elastomers, such as copolymers consisting of from 85 to 99.5% by weight of a $C_4$-$C_5$ olefin combined with about 0.5 to about 15% by weight of a conjugated multi-olefin having 4 to 14 carbon atoms, copolymers of isobutylene and isoprene where a major portion of the isoprene units combined therein have conjugated diene unsaturation (see, for example, U.S. Pat. No. 4,160,759; the entire contents of which are hereby incorporated by reference herein).

In certain embodiments, the second epoxy resin is an epoxidized polybutadiene diglycidylether oligomer or polymer.

In certain embodiments, epoxidized polybutadiene diglycidylether oligomers contemplated for use herein have the structure:

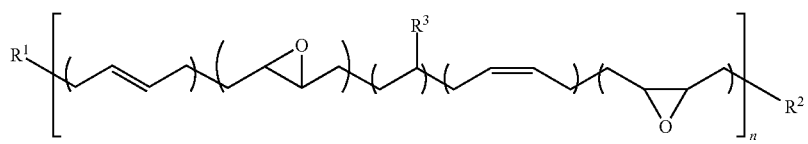

wherein:

R¹ and R² are each independently H or lower alkyl,

R³ is H, saturated or unsaturated hydrocarbyl, or epoxy, at least 1 epoxy-containing repeating unit set forth above, and at least one olefinic repeating unit set forth above are present in each oligomer, and, when present, in the range of 1-10 of each repeating unit is present, and n falls in the range of 2-150.

In certain embodiments, epoxidized polybutadiene diglycidylether oligomer or polymer contemplated for use in the practice of the present invention has the structure:

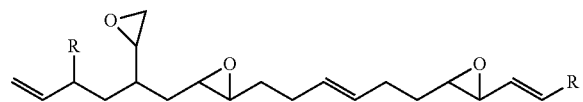

wherein R is H, OH, lower alkyl, epoxy, oxirane-substituted lower alkyl, aryl, alkaryl, and the like.

Examples of the second epoxy resin contemplated for use herein (i.e., epoxy having a flexible backbone) include:

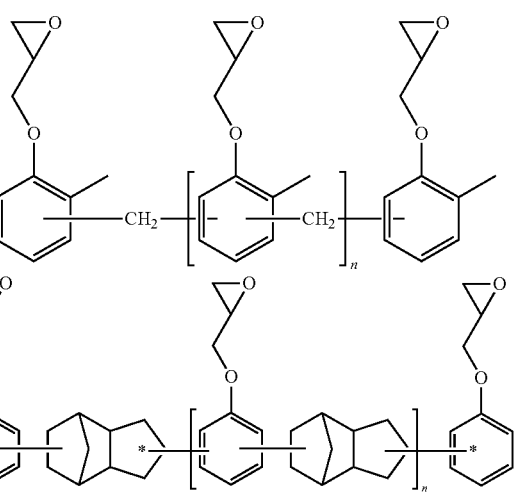

and the like.

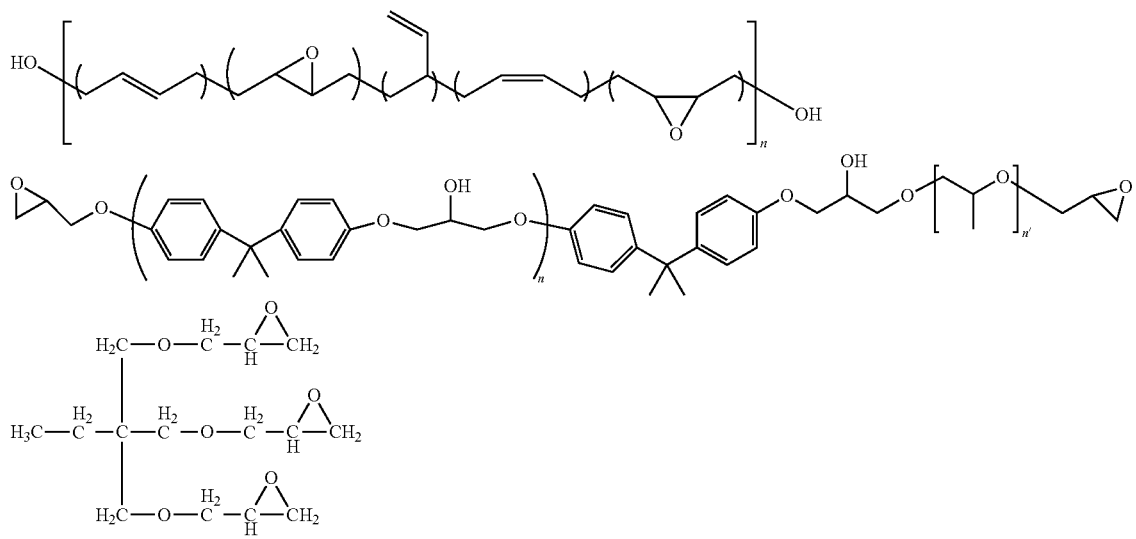

and the like.

In some embodiments, additional epoxy materials may be included in invention formulations. When included in invention formulations, a wide variety of epoxy-functionalized resins are contemplated for use herein, e.g., epoxy resins based on bisphenol A (e.g., Epon Resin 834), epoxy resins based on bisphenol F (e.g., RSL-1739), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200L, and the like, as well as mixtures of any two or more thereof.

Additional examples of conventional epoxy materials which are suitable for use as optional additional component of invention formulations include:

Conductive fillers contemplated for use in the practice of the present invention include silver, nickel, cobalt, copper, gold, palladium, platinum, carbon black, carbon fiber, graphite, carbon nanotubes, aluminum, indium tin oxide, silver-coated copper, silver-coated aluminum, silver-coated graphite, nickel-coated graphite, bismuth, tin, bismuth-tin alloy, metal-coated glass spheres silver-coated fiber, silver-coated spheres, antimony doped tin oxide, carbon nanotubes, conductive nanofillers, alloys of such metals, and the like, as well as mixtures of any two or more thereof.

Curing agents contemplated for use in the practice of the present invention include ureas, aliphatic and aromatic amines, polyamides, imidazoles, dicyandiamides, hydrazides, urea-amine hybrid curing systems, free radical initiators, organic bases, transition metal catalysts, phenols, acid anhydrides, Lewis acids, Lewis bases, and the like. See, for example, U.S. Pat. No. 5,397,618, the entire contents of which are hereby incorporated by reference herein.

Exemplary free radical initiators include peroxy esters, peroxy carbonates, hydroperoxides, alkylperoxides, arylperoxides, azo compounds, and the like.

Non-reactive diluents, when present, include aromatic hydrocarbons (e.g., benzene, toluene, xylene, and the like), saturated hydrocarbons (e.g., hexane, cyclohexane, heptane, tetradecane), chlorinated hydrocarbons (e.g., methylene chloride, chloroform, carbon tetrachloride, dichloroethane, trichloroethylene, and the like), ethers (e.g., diethyl ether, tetrahydrofuran, dioxane, glycol ethers, monoalkyl or dialkyl ethers of ethylene glycol, and the like), esters (e.g., ethyl acetate, butyl acetate, methoxy propyl acetate, and the like); dibasic esters, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, polyols (e.g., polyethylene glycol, propylene glycol, polypropylene glycol, and the like), ketones (e.g., acetone, methyl ethyl ketone, and the like), amides (e.g., dimethylformamide, dimethylacetamide, and the like), heteroaromatic compounds (e.g., N-methylpyrrolidone, and the like).

The amount of non-reactive diluent contemplated for use in accordance with the present invention can vary widely, so long as a sufficient quantity is employed to dissolve and/or disperse the components of invention compositions. When present, the amount of non-reactive diluent employed typically falls in the range of about 2 up to about 25 weight percent of the composition. In certain embodiments, the amount of non-reactive diluent falls in the range of about 5 up to 20 weight percent of the total composition. In some embodiments, the amount of non-reactive diluent falls in the range of about 10 up to about 18 weight percent of the total composition.

As readily recognized by those of skill in the art, in certain embodiments, invention compositions contain substantially no diluent therein. Even if diluent is, at one time, present, it is typically removed once manipulation of invention compositions (e.g., by coating as a film on a suitable substrate) has been completed.

In certain embodiments, compositions according to the present invention further comprise up to about 4 wt % acrylic polymer. Acrylates contemplated for use in the practice of the present invention are well known in the art. See, for example, U.S. Pat. No. 5,717,034, the entire contents of which are hereby incorporated by reference herein. Exemplary acrylic polymers have a molecular weight in the range of about 100,000 up to about 1,000,000 and a Tg in the range of about −40° C. up to about 20° C. In certain embodiments, acrylic polymers contemplated for optional use herein have a molecular weight in the range of about 200,000 up to about 900,000 and a Tg in the range of about −40° C. up to about 20° C.

In certain embodiments, compositions according to the present invention further comprise up to about 4 wt % polyurethane, polysiloxane, or the like.

As used herein, "polyurethane" refers to polymers composed of a chain of organic units joined by carbamate (also known as "urethane") linkers. Polyurethane polymers can be formed by reacting an isocyanate with a polyol. Both the isocyanates and polyols used to make polyurethanes typically contain on average two or more functional groups per molecule.

As used herein, "polysiloxane" refers to silicone resins, oligomers and polymers, silicone-bridged polymers, and mixed inorganic-organic polymers with the chemical formula $[R_2SiO]_n$, where R is an organic group such as methyl, ethyl, phenyl, or the like. These materials consist of an inorganic silicon-oxygen backbone ( . . . —Si—O—Si—O—Si—O— . . . ) with organic side groups (R) attached to the tetra-coordinate silicon atoms.

In certain embodiments, compositions according to the present invention optionally further comprise one or more flow additives, adhesion promoters, conductivity additives, rheology modifiers, or the like, as well as mixtures of any two or more thereof.

As used herein, "flow additives" refers to silicon polymers, ethyl acrylate/2-ethylhexyl acrylate copolymers, alkylol ammonium salt of phosphoric acid esters of ketoxime, and the like, as well as combinations of any two or more thereof.

The amount of each component of invention compositions can vary widely. Exemplary compositions comprise:
at least 1 wt % of said first maleimide, nadimide or itaconimide,
at least 1 wt % of said second maleimide, nadimide or itaconimide,
at least 2 wt % of said first epoxy resin (i.e., said rubber or elastomer-modified epoxy),
at least 0.5 wt % of said second epoxy resin (i.e., said epoxy resin having a flexible aliphatic or aliphatic/aromatic backbone),
at least 70 wt % of said conductive filler,
at least 0.3 wt % of said curing agent,
optionally up to 4 wt % of an acrylic polymer, and
optionally, up to 25 wt % of a non-reactive organic diluent therefore.

In some embodiments, the amount of each component of invention compositions falls in the range of about:
1-6 wt % of said first maleimide, nadimide or itaconimide,
1-8 wt % of said second maleimide, nadimide or itaconimide,
2-15 wt % of said first epoxy resin (i.e., said rubber or elastomer-modified epoxy),
0.5-8 wt % of said second epoxy resin (i.e., said epoxy resin having a flexible aliphatic or aliphatic/aromatic backbone),
70-95 wt % of said conductive filler,
0.3-4 wt % of said curing agent,
optionally up to 4 wt % of an acrylic polymer, and
optionally up to 25 wt % of a non-reactive organic diluent therefore.

In some embodiments, the amount of each component of invention compositions falls in the range of about:
2-4 wt % of said first maleimide, nadimide or itaconimide,
3-6 wt % of said second maleimide, nadimide or itaconimide,
6-12 wt % of said first epoxy resin (i.e., said rubber or elastomer-modified epoxy),
1-5 wt % of said second epoxy resin (i.e., said epoxy resin having a flexible aliphatic or aliphatic/aromatic backbone),
80-85 wt % of said conductive filler,
0.5-3 wt % of said curing agent,
optionally up to 4 wt % of an acrylic polymer, and
optionally up to 25 wt % of a non-reactive organic diluent therefore.

Invention compositions provide a number of useful performance properties. For example, when applied at a thickness of 0.2 mm on a suitable 10×10 mm copper substrate pad and cured at 200° C. for 60 minutes, invention compositions undergo less than 58 micron warpage.

In certain embodiments of the present invention, there are provided methods of making the composition described herein. Invention methods comprise subjecting the contemplated combination of components to high shear mixing for a time sufficient to obtain a substantially homogeneous blend.

In certain embodiments of the present invention, compositions as described herein are applied to a suitable substrate (e.g., a release liner), then b-staged at elevated temperature to remove substantially all of the solvent therefrom.

In certain embodiments of the present invention, there are provided conductive die attach films comprising the reaction product obtained upon removing substantially all of the solvent/diluent from the above-described b-staged compositions.

Exemplary conductive die attach films contemplated herein include films produced when said composition is cured at a temperature in the range of about 160-230° C. for a time in the range of about 30 minutes-2 hours. In some embodiments, conductive die attach films include those produced when compositions according to the present invention are cured at a temperature in the range of about 175-200° C. for about 1 hour.

Conductive die attach films according to the present invention, after cure, typically absorb less than about 1.2% by weight moisture when exposed to 85° C. at 85% relative humidity in a Dynamic Vapor Sorption Analyzer. In some embodiments, conductive die attach films according to the present invention, upon cure, absorb less than about 0.7% by weight moisture when exposed to 85° C. at 85% relative humidity in a Dynamic Vapor Sorption Analyzer.

Conductive die attach films according to the present invention, upon cure, typically have a Tg (as determined by thermomechanical analysis; TMA) of less than about 40° C.; in some embodiments, the Tg as determined by TMA is less than about 20° C. Thermomechanical analysis (TMA) is a technique used to study the properties of materials as they change with temperature. See an exemplary protocol therefor in Example 1 herein.

Alternatively, conductive die attach films according to the present invention, upon cure, typically have a Tan Delta Tg (as determined by dynamic mechanical analysis; DMA) of less than about 100° C.; in some embodiments, the Tan Delta Tg is less than about 80° C. Dynamic mechanical analysis is a technique used to determine the viscoelasticity of polymers. See an exemplary protocol therefor in Example 1 herein.

Conductive die attach films according to the present invention can also be characterized, upon cure, with reference to the tensile modulus thereof; in some embodiments, the tensile modulus of invention films (at 260° C.) is less than 1 GPa; in some embodiments, the tensile modulus (at 260° C.) is less than 500 Mpa.

Conductive die attach films according to the present invention, upon cure, can also be characterized with reference to the hot die shear thereof; in some embodiments, the hot die shear of said cured film at 260° C. is at least 0.5 kg/mm$^2$; in some embodiments, the hot die shear of said film is at least 0.8 kg/mm$^2$.

Conductive die attach films according to the present invention, upon cure, can also be characterized with reference to the hot, wet die shear thereof at 260° C. after exposure to 85° C. at 85% relative humidity for about 3 days; in some embodiments, the hot, wet die shear of said film after exposure to such conditions is at least 0.5 kg/mm$^2$; in some embodiments, the hot, wet die shear of said film after exposure to such conditions is at least 0.65 kg/mm$^2$.

In accordance with another embodiment of the present invention, there are provided methods for preparing conductive die attach films, said method comprising removing substantially all of the solvent/diluent from the above-described compositions after application thereof to a suitable substrate.

In accordance with yet another embodiment of the present invention, there are provided methods for preparing conductive die attach films, said method comprising curing the above-described compositions after application thereof to a suitable substrate, after optional b-staging thereof. In some embodiments, it is preferable that b-staging is carried out prior to curing of the above-described compositions.

Suitable substrates contemplated for use herein include lead-frame(s), laminate substrate(s) designed for semiconductor packages (e.g., BT substrate, FR4 substrate, and the like), polyethylene terephthalate, polymethyl methacrylate, polyethylene, polypropylene, polycarbonate, an epoxy resin, polyimide, polyamide, polyester, glass, and the like.

As used herein, "lead-frame(s)" comprise a base plate consisting of copper or copper alloys, and a protective coating formed on the upper (or both) surface(s) of the base plate. The protective coating is composed of at least one metal selected from the group consisting of gold, gold alloy, silver, silver alloy, palladium or palladium alloy, and has a thickness of about 10-500 angstrom. The protective coating is formed by suitable means, e.g., by vapor deposition. It is possible to form an intermediate coating of nickel or nickel alloys between the surface of the base plate and the protective coating, by means of vapor deposition or wet plating. A suitable thickness for the intermediate coating is within the range of about 50-20,000 angstrom. See, for example, U.S. Pat. No. 5,510,197, the entire contents of which are hereby incorporated by reference herein.

In accordance with yet another embodiment of the present invention, there are provided articles comprising conductive die attach films as described herein adhered to a suitable substrate therefor.

Articles according to the present invention can be characterized in terms of the adhesion of the cured conductive die attach film to the substrate; typically the adhesion is at least about 0.5 kg/mm$^2$ at 260° C.; in some embodiments, the adhesion is at least about 0.8 kg/mm$^2$ at 260° C.

Articles according to the present invention can also be characterized in terms of the Tg of the cured conductive die attach film, with a Tg (as determined by thermomechanical analysis; TMA) typically being less than about 40° C.; in some embodiments, the Tg is less than about 20° C.

Articles according to the present invention can alternatively be characterized with reference to the Tan Delta Tg of the cured conductive die attach film; typically, the conductive die attach film of invention articles has a Tan Delta Tg (as determined by dynamic mechanical analysis; DMA) of less than about 100° C.; in some embodiments, the Tg is less than about 80° C.

Articles according to the present invention can be further characterized with reference to the tensile modulus of said cured conductive die attach film at 260° C.; typically the tensile modulus is less than about 1 GPa; in some embodiments, the tensile modulus is less than about 500 MPa.

As readily recognized by those of skill in the art, the dimensions of invention articles can vary over a wide range. A particular advantage of invention formulations is their suitability for preparation of large dies. Exemplary articles typically have a surface area of at least 6 mm$^2$, and can be 2.5×2.5 mm, or 3×3 mm, or 4×4 mm, or 5×5 mm, or 6×6 mm, or 7×7 mm, or 8×8 mm, or 9×9 mm, or 10×10 mm, or the like.

In accordance with yet another embodiment of the present invention, there are provided methods for preparing a conductive network, said method comprising:

applying a composition as described herein to a suitable substrate in a predefined pattern, and thereafter curing said composition.

In accordance with still another embodiment of the present invention, there are provided conductive networks prepared as described herein.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

EXAMPLE 1

Sample Preparation

Comparison formulations and formulations according to the invention were prepared by combining the components set forth in Table 1, as follows.

Slurry Preparation

Solid resins were pre-dissolved in suitable solvent as follows. The required amounts of the organic components were weighed into a container, hand mixed for about 5 minutes, then sufficient solvent was added to fill 5-25% of the container. Pre-mixing continued for about 5-10 minutes with a high speed mixer. The required amount of filler was then added to the container, and the contents thereof subjected to high speed mixing (about 1000-3000 rpm) for about one hour. The resulting slurry was de-gassed by subjecting same to reduced pressure for about 1-10 minutes.

Film Preparation

Conductive films were prepared by pouring the slurry onto a clean, prepared surface using a coating machine. The slurry was subsequently heated in a retort oven to produce a stable coating film that is well bonded to the substrate (the release liner). A cover liner is than applied onto the film to protect the surface thereof. In some circumstances, it may be desirable to laminate the film under heat and pressure to promote the formation of substantially even film coatings.

TABLE 1

| | Formulation | | |
|---|---|---|---|
| | A | B | C |
| Ingredient | Amount (wt %) | | |
| First BMI | 5.95 | 3.95 | 2.75 |
| Second BMI | — | — | 2.9 |
| First Epoxy | 11.22 | 8.35 | 7.4 |
| Second Epoxy | — | 4.5 | 3.7 |
| Dicyandiamide | 0.53 | 0.7 | 0.7 |
| Conductivity promoter | 0.07 | 0.07 | 0.07 |
| Adhesion promoter | 0.23 | 0.23 | 0.23 |
| Silver filler | 82 | 82.2 | 82.2 |
| Total | 100 | 100 | 100 |

Each of formulations A, B and C were subjected to a number of analyses.

TMA

For example, 5×5 mm samples, approximately 1-2 mm thick, were subjected to a 30-45 minute ramp-up from room temperature to 200° C., maintained for one hour at 200° C., then subjected to thermomechanical analysis (TMA) on a Perkin-Elmer Instrument with an expansion fixture with an applied force of 20 mN. The heat/cool/hold parameters are summarized below:

1. Heat from 5° to 200° C. at 20° C./min
2. Cool from 200° C. to −85° C. at 50° C./min
3. Hold 5 min @-85° C.
4. Heat from −85° C. to 250° C. at 10° C./min.

Data collection was carried out on the second heating run; data collected were used for determination of glass transition temperature (Tg), coefficient of thermal expansion 1 (CTE1), and coeffecient of thermal expansion 2 (CTE2).

DMA

DMA analysis of tensile modulus was performed on film samples employing a TA Instruments, TA-Q800 using a flat edge tension film fixture on the TA-Q800. Sample dimensions were approximately (24×8×0.2 mm). Samples were cured by subjecting them to a 30-45 min ramp from room temperature to 200° C., then soaked for about 1 hr at 200° C.

DMA was carried out at a ramp rate of 5.0° C./min starting at −70° C. up to 300° C. The frequency was 10 Hz and 5 microns was applied for strain amplitude. Results are presented in Table 2.

TABLE 2

| Formulation | A | B | C |
|---|---|---|---|
| Moisture absorption, % | 0.6 | 1.87 | 0.41 |
| Adhesion at 260° C., kg/mm$^2$ | 1.2 | 0.45 | 0.92 |
| Warpage, μm | 75 | 75 | 45 |
| Tg by TMA | 22.21 | 37.13 | 5.04 |
| Tg by DMA | 265 | 189 | 47 |
| Modulus at RT (MPa) | 12,233 | 6,386 | 3,333 |
| Modulus at 260° C. (MPa) | 1,667 | 218 | 102 |

The results set forth in Table 2 demonstrate that excellent performance properties (e.g., low moisture absorption, good adhesion, low warpage, low Tg, low modulus) are obtained with test films based on formulations according to the present invention.

EXAMPLE 2

Warpage Test Method

A test vehicle (QFN12×12 PPF leadframe with 8 mm×8 mm×300 μM thick dies on a 9.9 mm×9.9 mm pad was subjected to a 30 min. ramp+60 min. hold at 200° C. cure, and the resulting warpage measured. Results are presented in Table 3.

TABLE 3

| | Material | | |
|---|---|---|---|
| Data Point | A | B | C |
| 1 | 74.1 | 74.7 | 42.8 |
| 2 | 77.1 | 75.2 | 45.4 |
| 3 | 71.7 | 74.4 | 43.5 |
| 4 | 73.2 | 75 | 44.4 |
| 5 | 77.1 | 74.5 | 49.5 |
| 6 | 74.3 | 74.5 | 43.5 |
| 7 | 73.1 | 74.8 | 45.4 |
| 8 | 75.4 | 75.6 | 48 |
| 9 | 75.6 | 74.7 | 43.5 |
| 10 | 73.6 | 76.2 | 43.9 |
| 11 | 75 | 75.8 | 48 |
| 12 | 73.9 | 69.8 | 43.6 |
| Average, μm | 74.51 | 74.60 | 45.13 |
| Change, % | 0.00 | 0.12 | −39.44 |

The results set forth in Table 3 demonstrate that invention formulations are far less prone to warpage than are formulations lacking one or more of the components contemplated for use herein.

EXAMPLE 3

MSL Testing

MSL (moisture sensitivity levels) were determined according to JEDEC Standard J-STD-20 under the following conditions:

MSL1: 85° C. and 85% relative humidity for 168 hours;
MSL2: 85° C. and 60% relative humidity for 168 hours; and
MSL3: 30° C. and 60% relative humidity for 192 hours.

The results are summarized below:

| Materials | | |
|---|---|---|
| A | B | C |
| MSL2 Capable | MSL3 Capable | MSL1 Capable |

Review of the results above reveals that only invention formulations (e.g., Formulation C) are capable of meeting the more stringent conditions required by the MSL1 standard.

EXAMPLE 4

Thermal Cycle Testing

12×12 mm packages with 8×8×0.3 mm dies thereon were subjected to board-level temperature cycling for 2000 cycles between room temperature and 200° C. with a 30 minute ramp up and 60 minute hold at 200° C. Results are summarized below.

| Materials | | |
|---|---|---|
| A | B | C |
| More than 50% die attach failure | Not available (due to poor MSL results; see preceding example) | Less than 10% die attach failure |

Review of the results above reveals that invention formulations (e.g., Formulation C) perform very well when subjected to multiple temperature cycles, providing far better adhesion than comparative formulations lacking one or more of the components required by invention formulations.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A composition comprising:
a first maleimide, nadimide or itaconimide, wherein said first maleimide, nadimide or itaconimide has an aromatic backbone, and the degree of substitution of imide moieties on the backbone of said first maleimide, nadimide or itaconimide is at least 0.5 imide moieties per repeat unit of said backbone,
a second maleimide, nadimide or itaconimide, wherein said second maleimide, nadimide or itaconimide has a flexible aliphatic or aliphatic/aromatic backbone, wherein the backbone of said second maleimide, nadimide or itaconimide includes straight or branched chain hydrocarbyl segments, wherein each hydrocarbyl segment has at least 20 carbons,
a first epoxy resin, wherein said first epoxy resin is rubber or elastomer-modified,
a second epoxy resin, wherein said second epoxy resin has a flexible aliphatic or aliphatic/aromatic backbone, wherein the backbone of said second epoxy resin includes straight or branched chain hydrocarbyl segments, wherein each hydrocarbyl segment has at least 20 carbons, backbone,
a conductive filler,
a curing agent; and
optionally a non-reactive organic diluent therefore;
wherein:
said composition, when cured, has a modulus less than about 1 GPa when tested by dynamic mechanical analysis (DMA) at 260° C.

2. The composition of claim 1 optionally further comprising one or more flow additives, adhesion promoters, conductivity additives, rheology modifiers, or mixtures of any two or more thereof.

3. The composition of claim 1 wherein the degree of substitution of imide moieties on the backbone of said first maleimide, nadimide or itaconimide is at least 0.8 imide moieties per repeat unit of said backbone.

4. The composition of claim 1 wherein said first maleimide, nadimide or itaconimide has the structure:

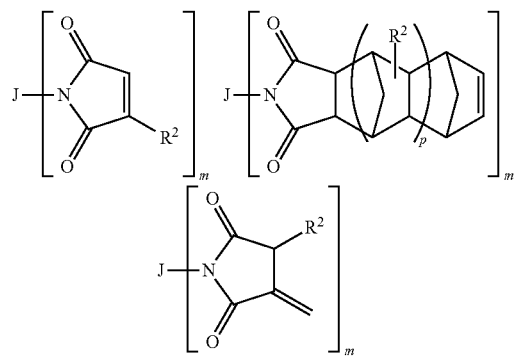

respectively, wherein:
m is 1-15,
p is 0-15,
each $R^2$ is independently selected from hydrogen or lower alkyl, and J is a monovalent or a polyvalent radical selected from:
aromatic hydrocarbyl or substituted aromatic hydrocarbyl species having in the range of about 6 up to about 300 carbon atoms, where the aromatic hydrocarbyl species is selected from aryl, alkylaryl, arylalkyl, aryalkenyl, alkenylaryl, arylalkynyl or alkynylaryl;
aromatic hydrocarbylene or substituted aromatic hydrocarbylene species having in the range of about 6 up to about 300 carbon atoms, where the aromatic hydrocarbylene species are selected from arylene, alkylarylene, arylalkylene, arylalkenylene, alkenylarylene, arylalkynylene or alkynylarylene,
heterocyclic or substituted heterocyclic species having in the range of about 6 up to about 300 carbon atoms,
polysiloxane, or
polysiloxane-polyurethane block copolymers, as well as
combinations of one or more of the above with a linker selected from a covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—;
where each R is independently hydrogen, alkyl or substituted alkyl.

5. The composition of claim 4 wherein J is heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

6. The composition of claim 1 wherein the backbone of said second maleimide, nadimide or itaconimide contains straight or branched chain hydrocarbyl segments, wherein each hydrocarbyl segment has at least 30 carbons, thereby enhancing the flexibility thereof.

7. The composition of claim 1 wherein said second maleimide, nadimide or itaconimide has the structure:

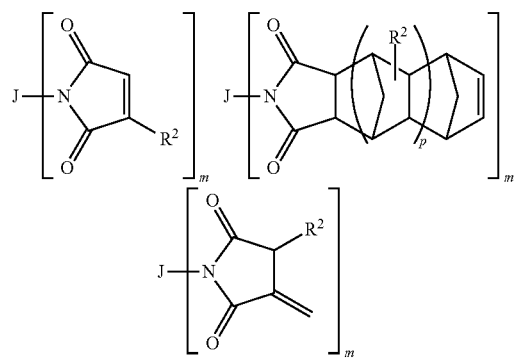

respectively, wherein:
m is 1-15,
p is 0-15,
each R$^2$ is independently selected from hydrogen or lower alkyl, and
J is a monovalent or a polyvalent radical selected from:
non-aromatic hydrocarbyl or substituted non-aromatic hydrocarbyl species having in the range of about 20 up to about 500 carbon atoms, where the non-aromatic hydrocarbyl species is selected from alkyl, alkenyl, alkynyl, cycloalkyl, or cycloalkenyl;
non-aromatic hydrocarbylene or substituted non-aromatic hydrocarbylene species having in the range of about 20 up to about 500 carbon atoms, where the non-aromatic hydrocarbylene species are selected from alkylene, alkenylene, alkynylene, cycloalkylene, or cycloalkenylene,
heterocyclic or substituted heterocyclic species having in the range of about 20 up to about 500 carbon atoms,
polysiloxane, or
polysiloxane-polyurethane block copolymers, as well as
combinations of one or more of the above with a linker selected from a covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C (O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—;

where each R is independently hydrogen, alkyl or substituted alkyl.

8. The composition of claim 7 wherein J is oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

9. The composition of claim 1 wherein said first epoxy resin is an epoxidized carboxyl-terminated butadiene-acrylonitrile (CTBN) oligomer or polymer.

10. The composition of claim 9 wherein said epoxidized CTBN oligomer or polymer is an epoxy-containing derivative of an oligomeric or polymeric precursor having the structure:

HOOC[(Bu)$_x$(ACN)$_y$]$_m$COOH wherein:
each Bu is a butylene moiety (e.g., 1,2-butadienyl or 1,4-butadienyl),
each ACN is an acrylonitrile moiety,
the Bu units and the ACN units can be arranged randomly or in blocks,
each of x and y are greater than zero, provided the total of x+y=1,
the ratio of x:y falls in the range of about 10:1-1:10, and
m falls in the range of about 20-about 100.

11. The composition of claim 1 wherein said second epoxy is an epoxidized polybutadiene diglycidylether oligomer.

12. The composition of claim 11 wherein said epoxidized polybutadiene diglycidylether oligomer has the structure:

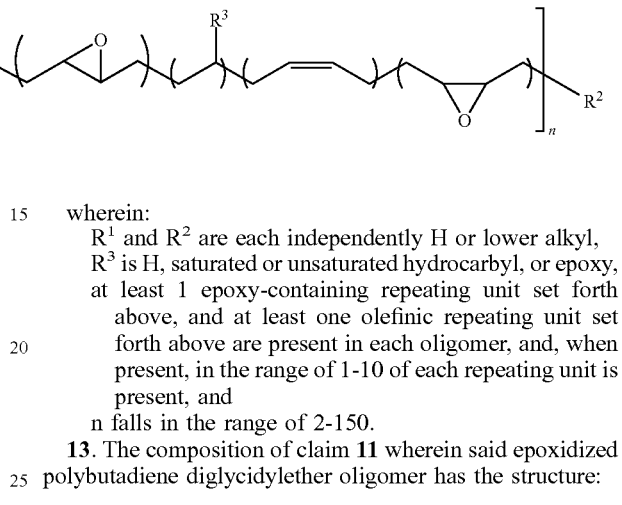

wherein:
R$^1$ and R$^2$ are each independently H or lower alkyl,
R$^3$ is H, saturated or unsaturated hydrocarbyl, or epoxy,
at least 1 epoxy-containing repeating unit set forth above, and at least one olefinic repeating unit set forth above are present in each oligomer, and, when present, in the range of 1-10 of each repeating unit is present, and
n falls in the range of 2-150.

13. The composition of claim 11 wherein said epoxidized polybutadiene diglycidylether oligomer has the structure:

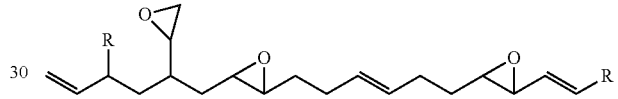

wherein R is H, OH, lower alkyl, epoxy, oxirane-substituted lower alkyl, aryl or alkaryl.

14. The composition of claim 1 wherein said conductive filler is selected from silver, nickel, cobalt, copper, gold, palladium, platinum, carbon black, carbon fiber, graphite, aluminum, indium tin oxide, silver-coated copper, silver-coated aluminum, silver-coated graphite, nickel-coated graphite, bismuth, tin, bismuth-tin alloy, metal-coated glass spheres silver-coated fiber, silver-coated spheres, antimony doped tin oxide, carbon nanotubes, conductive nanofillers, alloys of such metals, as well as mixtures of any two or more thereof.

15. The composition of claim 1 wherein said curing agent comprises ureas, aliphatic and aromatic amines, amine hardeners, polyamides, imidazoles, dicyandiamides, hydrazides, urea-amine hybrid curing systems, free radical initiators organic bases, transition metal catalysts, phenols, acid anhydrides, Lewis acids, and/or Lewis bases.

16. The composition of claim 1 wherein said diluent, when present, is an aromatic hydrocarbon, a chlorinated hydrocarbon, an ether, a polyol, a ketone, an amide, or a heteroaromatic compound.

17. The composition of claim 1 further comprising up to about 4 wt % of an additional polymeric moiety selected from an acrylic polymer, a polyurethane or a polysiloxane.

18. The composition of claim 17 wherein said additional polymeric moiety is an acrylic polymer having a molecular weight in the range of about 100,000 up to about 1,000,000 and a Tg in the range of about −40° C. up to about 20° C.

19. The composition of claim 1, wherein said composition, when applied at a thickness of 0.2 mm on a suitable 10×10 mm copper substrate pad and cured at 200° C. for 60 minutes, undergoes less than 58 micron warpage.

20. The composition of claim 1 wherein the water absorption of said composition upon cure, when exposed to a relative humidity of 85 at 85° C. in a Dynamic Vapor Sorption Analyzer is less than 1 wt %.

21. The composition of claim 1 wherein the water absorption of said composition upon cure, when exposed to a relative humidity of 85 at 85° C. in a Dynamic Vapor Sorption Analyzer, is less than 0.5 wt %.

22. The composition of claim 1 wherein said composition comprises:
at least 1 wt % of said first maleimide, nadimide or itaconimide,
at least 1 wt % of said second maleimide, nadimide or itaconimide,
at least 2 wt % of said first epoxy,
at least 0.5 wt % of said second epoxy,
at least 70 wt % of said conductive filler,
at least 0.3 wt % of said curing agent,
optionally up to 4 wt % of an additional polymeric moiety selected from an acrylic polymer, a polyurethane or a polysiloxane, and
optionally, up to 25 wt % of a non-reactive organic diluent therefore.

23. The composition of claim 22 wherein said composition comprises:
1-6 wt % of said first maleimide, nadimide or itaconimide,
1-8 wt % of said second maleimide, nadimide or itaconimide,
2-15 wt % of said first epoxy,
0.5-8 wt % of said second epoxy,
70-95 wt % of said conductive filler,
0.3-4 wt % of said curing agent,
optionally up to 4 wt % of an additional polymeric moiety selected from an acrylic polymer, a polyurethane or a polysiloxane, and
optionally up to 25 wt % of a non-reactive organic diluent therefore.

24. A method of making the composition of claim 1, said method comprising subjecting the combination of components to high shear mixing for a time sufficient to obtain a substantially homogeneous blend.

25. A conductive die attach film comprising the reaction product obtained upon removing substantially all of the solvent/diluent from the composition of claim 1.

26. The conductive die attach film of claim 25 wherein said composition is cured at a temperature in the range of about 160-230° C. for a time in the range of about 30 minutes-2 hours.

27. The conductive die attach film of claim 26 wherein said film absorbs less than 1.2% by weight moisture when exposed to 85° C. at 85% relative humidity in a Dynamic Vapor Sorption Analyzer.

28. The conductive die attach film of claim 26 wherein the film has a Tg (as determined by thermomechanical analysis; TMA) of less than about 40° C.

29. The conductive die attach film of claim 26 wherein the film has a Tan Delta Tg (as determined by dynamic mechanical analysis; DMA) of less than about 100° C.

30. The conductive die attach film of claim 26 wherein the tensile modulus of said film at 260° C. is less than 1 GPa.

31. The conductive die attach film of claim 26 wherein the die shear of said film at 260° C. is at least 0.5 kg/mm$^2$.

32. The conductive die attach film of claim 26 wherein the die shear of said film at 260° C. after exposure to 85° C. at 85% relative humidity for about 3 days is at least 0.5 kg/mm$^2$.

33. A method for preparing a conductive die attach film, said method comprising b-staging the composition of claim 1 after application thereof to a suitable substrate.

34. The method of claim 33 wherein said suitable substrate is selected from lead-frame(s), laminate substrate(s) designed for semiconductor packages, a polyethylene terephthalate, a polymethyl methacrylate, a polyethylene, a polypropylene, a polycarbonate, an epoxy resin, a polyimide, a polyamide, a polyester, or glass.

35. The method of claim 33 further comprising curing said conductive die attach film.

36. An article comprising a conductive die attach film according to claim 25 adhered to a suitable substrate therefor.

37. The article of claim 36 wherein the adhesion of said conductive die attach film to said substrate is at least 0.5 kg/mm$^2$ at 260° C.

38. The article of claim 36 wherein the conductive die attach film, upon curing, has a Tg (as determined by thermomechanical analysis; TMA) of less than about 40° C.

39. The article of claim 36 wherein the conductive die attach film, after curing, has a Tan Delta Tg (as determined by dynamic mechanical analysis; DMA) of less than about 100° C.

40. The article of claim 36 wherein the tensile modulus of said conductive die attach film at 260° C., after curing, is less than 1 GPa.

41. The article of claim 36 further comprising a die, wherein the dimensions of said die are at least 2.5×2.5 mm.

42. A method for preparing a conductive network, said method comprising:
applying a composition according to claim 1 to a suitable substrate in a predefined pattern,
optionally removing solvent/diluent therefrom, and thereafter curing said composition.

43. A conductive network prepared by the method of claim 42.

44. A method for preparing a conductive network, said method comprising:
applying a composition according to claim 1 to a suitable substrate in a predefined pattern,
removing solvent/diluent therefrom, and thereafter curing said composition.

45. A conductive network prepared by the method of claim 44.

* * * * *